US011337334B2

(12) United States Patent
Sung et al.

(10) Patent No.: US 11,337,334 B2
(45) Date of Patent: May 17, 2022

(54) LIQUID SUPPLY DEVICE AND LIQUID COOLING SYSTEM

(71) Applicant: COOLER MASTER CO., LTD., New Taipei (TW)

(72) Inventors: Chia-Hao Sung, New Taipei (TW); Chu-Yi Kuo, New Taipei (TW); Pen-Hung Liao, New Taipei (TW); Ming-Wei Lee, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 139 days.

(21) Appl. No.: 14/831,886

(22) Filed: Aug. 21, 2015

(65) Prior Publication Data

US 2017/0034950 A1 Feb. 2, 2017

(30) Foreign Application Priority Data

Jul. 31, 2015 (CN) .......................... 201520571191.7

(51) Int. Cl.
*H05K 7/20* (2006.01)
*G06F 1/20* (2006.01)

(52) U.S. Cl.
CPC ........... *H05K 7/20272* (2013.01); *G06F 1/20* (2013.01)

(58) Field of Classification Search
CPC ................ G01B 7/14; G01L 9/14; G01F 1/52
USPC ....................................................... 165/11.2
See application file for complete search history.

(56) References Cited

U.S. PATENT DOCUMENTS

| | | | | |
|---|---|---|---|---|
| 3,677,334 A * | 7/1972 | Bathla | ..................... | F28F 27/00 165/11.1 |
| 4,804,944 A * | 2/1989 | Golladay | .............. | G01F 23/686 340/624 |
| 5,293,754 A * | 3/1994 | Mizuno | ................. | H01L 23/473 165/104.27 |
| 5,789,915 A * | 8/1998 | Ingraham | ............... | G01D 5/145 324/207.2 |
| 6,481,278 B1 * | 11/2002 | Kaylor | .................... | G01F 23/74 200/84 C |
| 6,741,464 B2 * | 5/2004 | Kitano | .................... | G06F 1/203 165/104.33 |
| 6,906,919 B2 * | 6/2005 | Pokharna | ................ | G06F 1/203 165/86 |
| 7,249,625 B2 * | 7/2007 | Duan | ........................ | G06F 1/20 165/104.28 |
| 7,661,442 B2 * | 2/2010 | O'Brien, II | .............. | B60K 6/12 138/30 |

(Continued)

FOREIGN PATENT DOCUMENTS

CN 2886531 Y * 4/2007

*Primary Examiner* — Harry E Arant
(74) *Attorney, Agent, or Firm* — Dickinson Wright PLLC (57) ABSTRACT

A liquid supply device adapted to a liquid cooling system includes a casing, a cover, a plunger, a driving unit and a sensing unit. The casing has a liquid outlet. The cover is connected to the casing. A chamber is formed between the casing and the cover and contains a cooling liquid. The chamber communicates with the liquid outlet. The plunger is movably disposed in the chamber. The driving unit is disposed in the chamber and used for driving the plunger to move. The sensing unit is selectively disposed on one of the casing and the plunger. The sensing unit senses a liquid level of the cooling liquid and outputs a sensing signal with a predetermined status as the liquid level is equal to or lower than a predetermined height.

14 Claims, 10 Drawing Sheets

(56) References Cited

U.S. PATENT DOCUMENTS

| | | | |
|---|---|---|---|
| 8,382,008 B1 | 2/2013 | Ricciardi | |
| 9,303,713 B2* | 4/2016 | Ehre | F16F 9/0218 |
| 9,909,601 B2* | 3/2018 | Heerdt | F15B 15/2861 |
| 2003/0035986 A1* | 2/2003 | Yang | H01M 8/04097 |
| | | | 429/415 |
| 2005/0155427 A1* | 7/2005 | Magers | G01F 23/74 |
| | | | 73/314 |
| 2009/0140730 A1* | 6/2009 | Newman | G01D 5/145 |
| | | | 324/207.24 |
| 2011/0100597 A1* | 5/2011 | Wang | G06F 1/20 |
| | | | 165/71 |
| 2011/0303003 A1* | 12/2011 | Eccles | G01F 23/0084 |
| | | | 73/290 R |
| 2013/0074967 A1* | 3/2013 | Marin | F15B 1/04 |
| | | | 138/31 |

* cited by examiner

LIQUID SUPPLY DEVICE AND LIQUID COOLING SYSTEM

BACKGROUND OF THE INVENTION

1. Field of the Invention

The invention relates to a liquid supply device and a liquid cooling system and, more particularly, to a liquid supply device with a liquid level detecting function and a liquid cooling system equipped with the liquid supply device.

2. Description of the Prior Art

In general, a liquid cooling system essentially consists of a liquid cooling head, a radiator, a pump and a liquid storage box connected through a plurality of tubes. When the liquid cooling system is dissipating heat from an electronic component, the pump transports a cooling liquid to the liquid cooling head, the cooling liquid absorbs the heat generated by the electronic component, and then the radiator cools the cooling liquid. After the liquid cooling system is used for a long time, the cooling liquid will reduce due to vaporization, such that the cooling liquid may be insufficient. If the user does not supply the cooling liquid in time, the liquid cooling system may be damaged due to insufficient cooling liquid.

SUMMARY OF THE INVENTION

The invention provides a liquid supply device with a liquid level detecting function and a liquid cooling system equipped with the liquid supply device, so as to solve the aforesaid problems.

According to an embodiment of the invention, a liquid supply device with a liquid level detecting function comprises a casing, a cover, a plunger, a driving unit and a sensing unit. The casing has a liquid outlet. The cover is connected to the casing. A chamber is formed between the casing and the cover and contains a cooling liquid. The chamber communicates with the liquid outlet. The plunger is movably disposed in the chamber. The driving unit is disposed in the chamber and the driving unit drives the plunger to move. The sensing unit is selectively disposed on one of the casing and the plunger. The sensing unit senses a liquid level of the cooling liquid and outputs a sensing signal with a predetermined status as the liquid level is equal to or lower than a predetermined height.

According to another embodiment of the invention, a liquid cooling system comprises a liquid cooling head, a radiator, a plurality of tubes and a liquid supply device. The tubes are connected between the liquid cooling head and the radiator. The liquid supply device is selectively connected to one of the liquid cooling head, the radiator and the tubes. The liquid supply device comprises a casing, a cover, a plunger, a driving unit and a sensing unit. The casing has a liquid outlet. The cover is connected to the casing. A chamber is formed between the casing and the cover and contains a cooling liquid. The chamber communicates with the liquid outlet. The plunger is movably disposed in the chamber. The driving unit is disposed in the chamber and the driving unit drives the plunger to move. The sensing unit is selectively disposed on one of the casing and the plunger. The sensing unit senses a liquid level of the cooling liquid and outputs a sensing signal with a predetermined status as the liquid level is equal to or lower than a predetermined height.

As mentioned in the above, the liquid supply device of the invention is selectively connected to one of the liquid cooling head, the radiator and the tubes. When the cooling liquid reduces and then the hydraulic pressure of the liquid cooling system reduces, the liquid supply device utilizes the driving unit to drive the plunger to move, so as to inject the cooling liquid from the chamber into the liquid cooling system. In other words, the liquid supply device of the invention can supply the cooling liquid to the liquid cooling system automatically when the cooling liquid is insufficient, so as to prevent the liquid cooling system from being damaged due to insufficient cooling liquid. Furthermore, when the cooling liquid of the liquid supply device reduces and then the plunger moves to a specific position, the sensing unit will sense the liquid level of the cooling liquid and output the sensing signal with the predetermined status as the liquid level is equal to or lower than a predetermined height. When a processor receives the sensing signal with the predetermined status, the processor may send out an alarm message (e.g. light, sound or text), so as to notice a user to supply the cooling liquid to the liquid supply device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
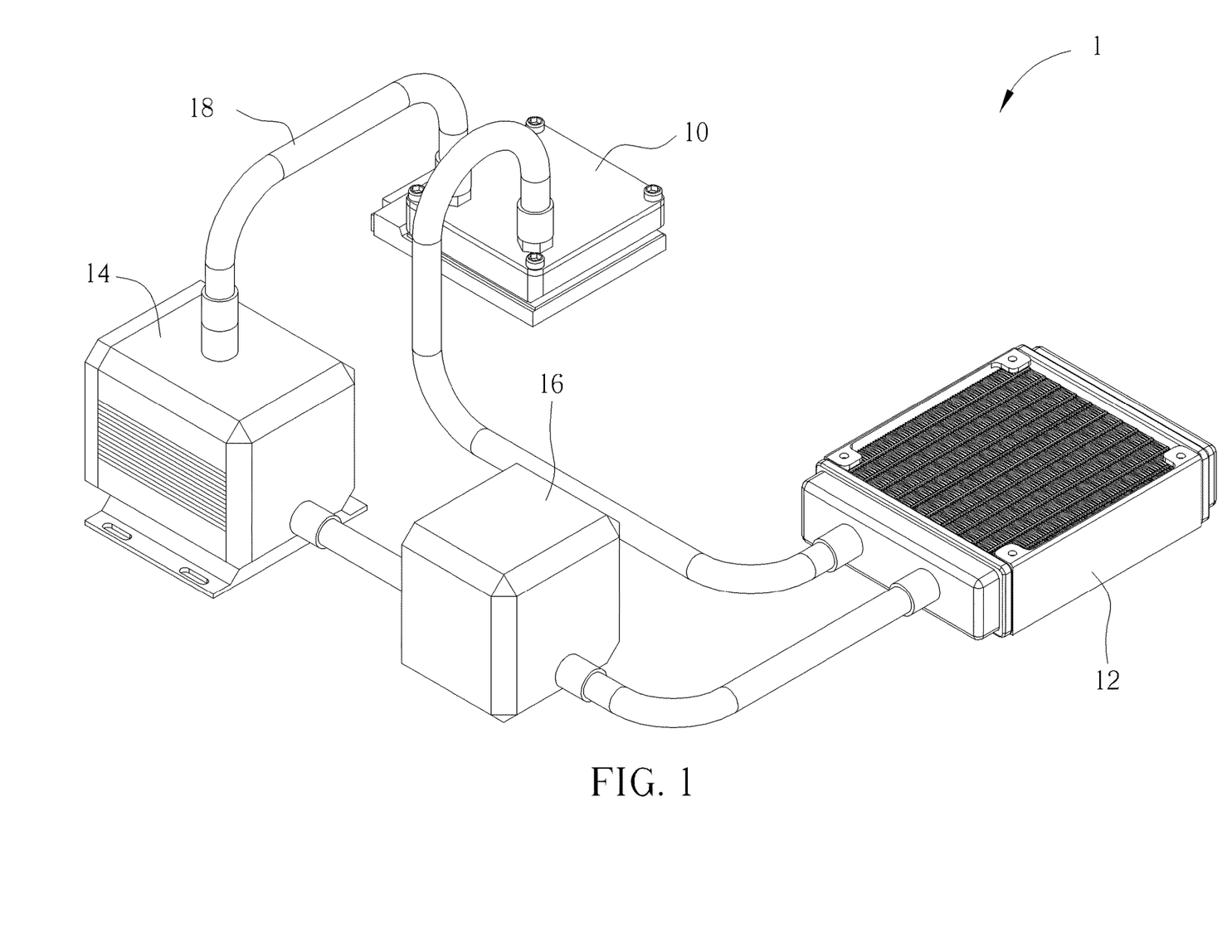
FIG. 1 is a schematic view illustrating a liquid cooling system according to an embodiment of the invention.
Figure 2:
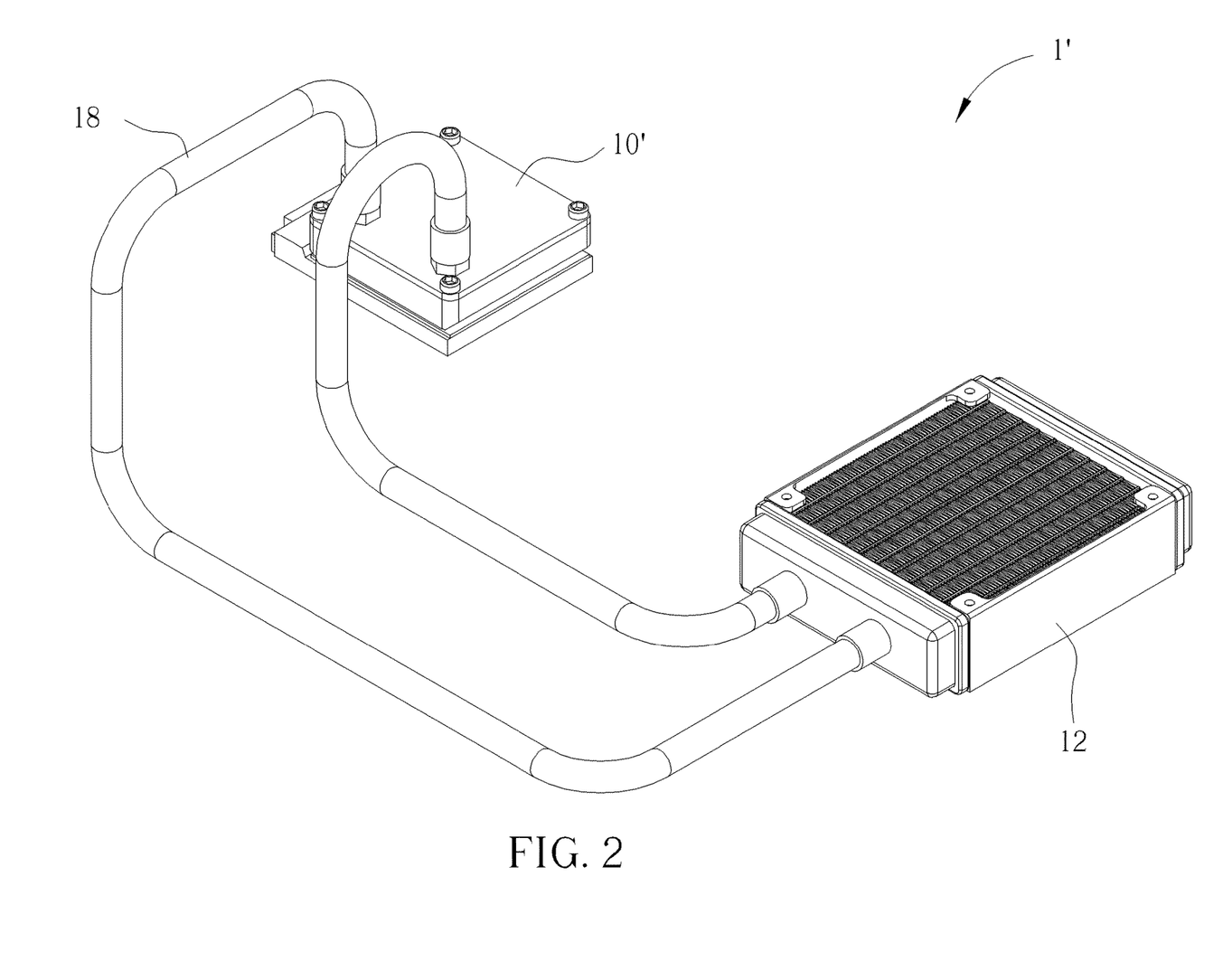
FIG. 2 is a schematic view illustrating a liquid cooling system according to another embodiment of the invention.
Figure 3:
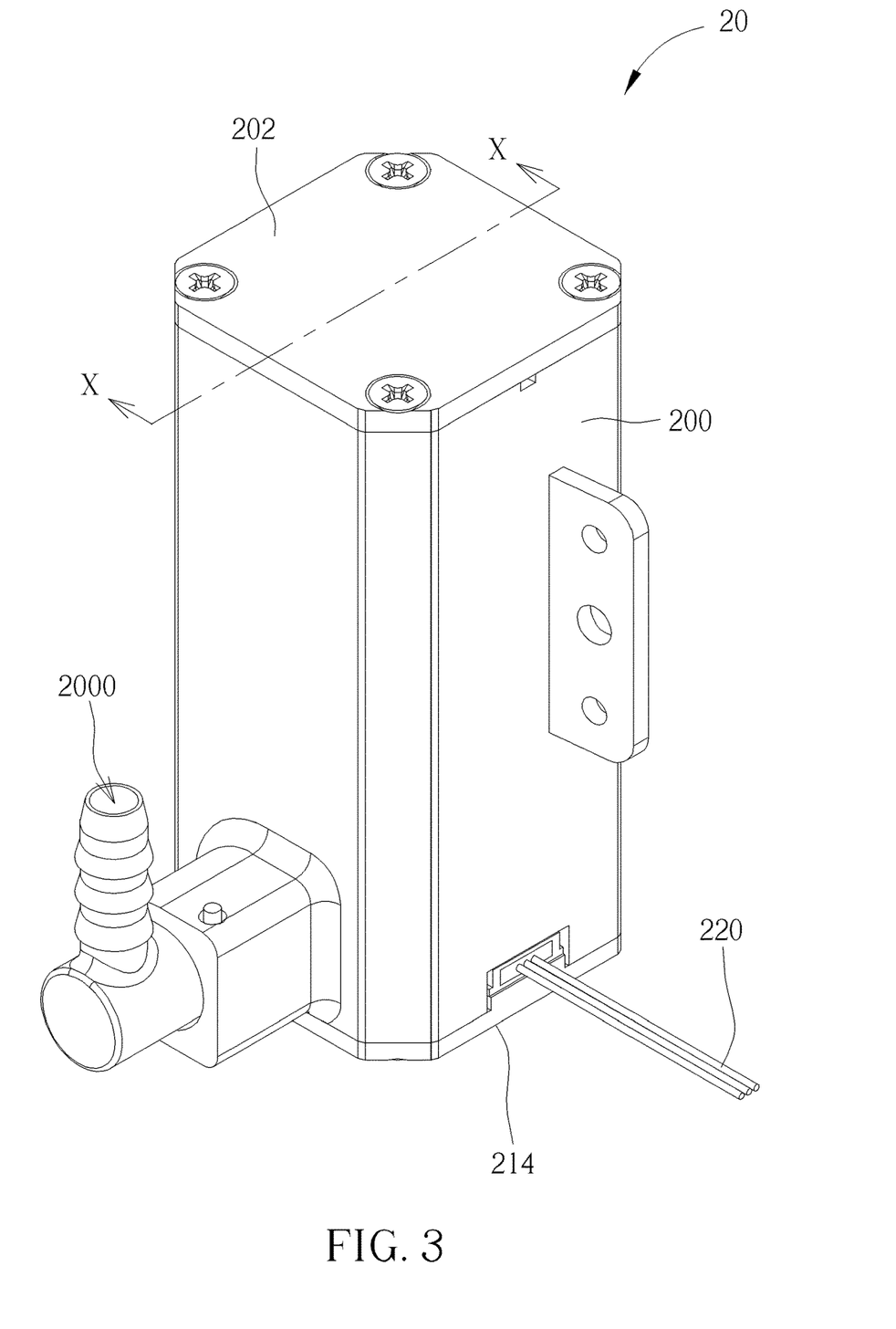
FIG. 3 is a schematic view illustrating a liquid supply device according to an embodiment of the invention.
Figure 4:
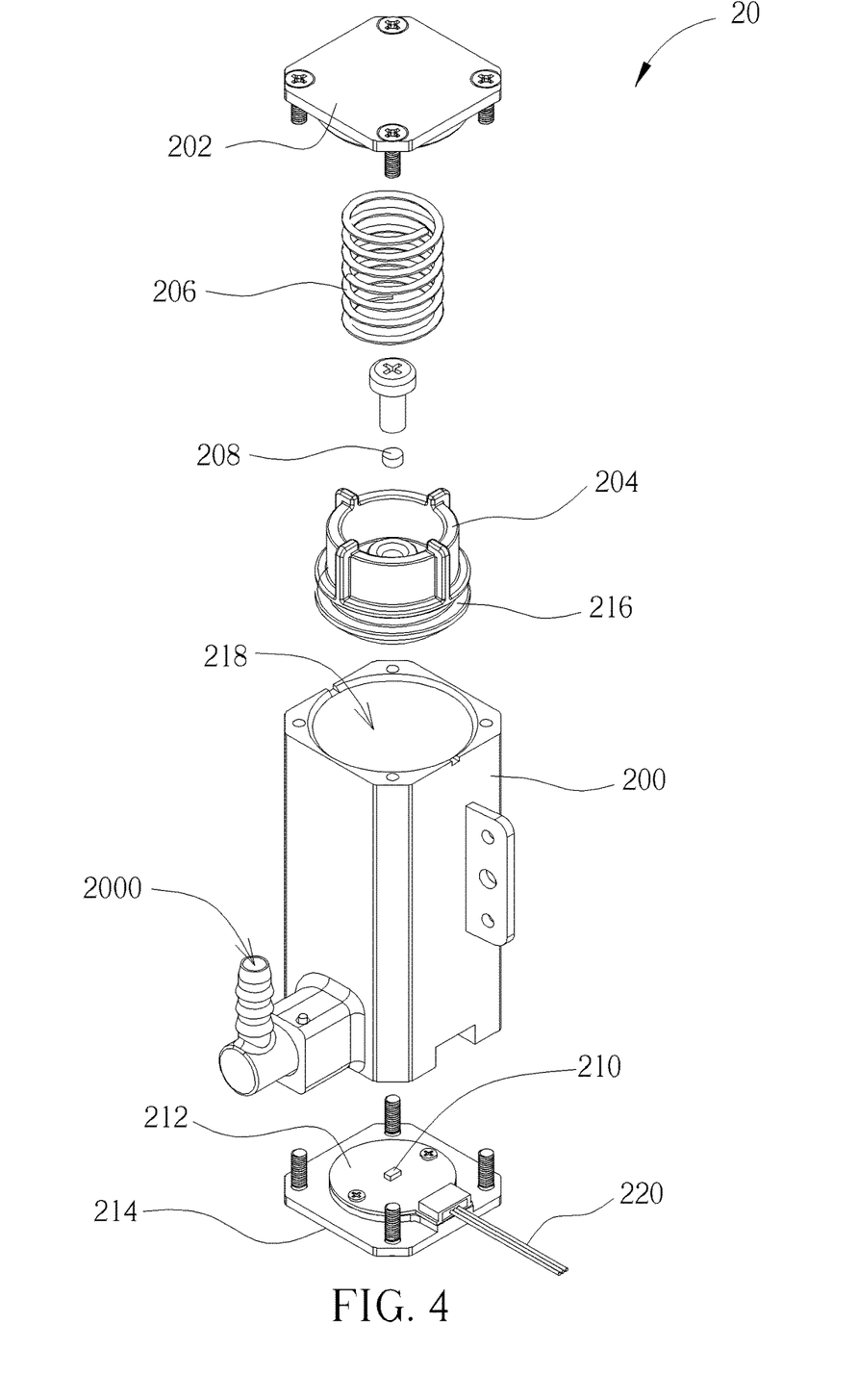
FIG. 4 is an exploded view illustrating the liquid supply device shown in FIG. 3.
Figure 5:
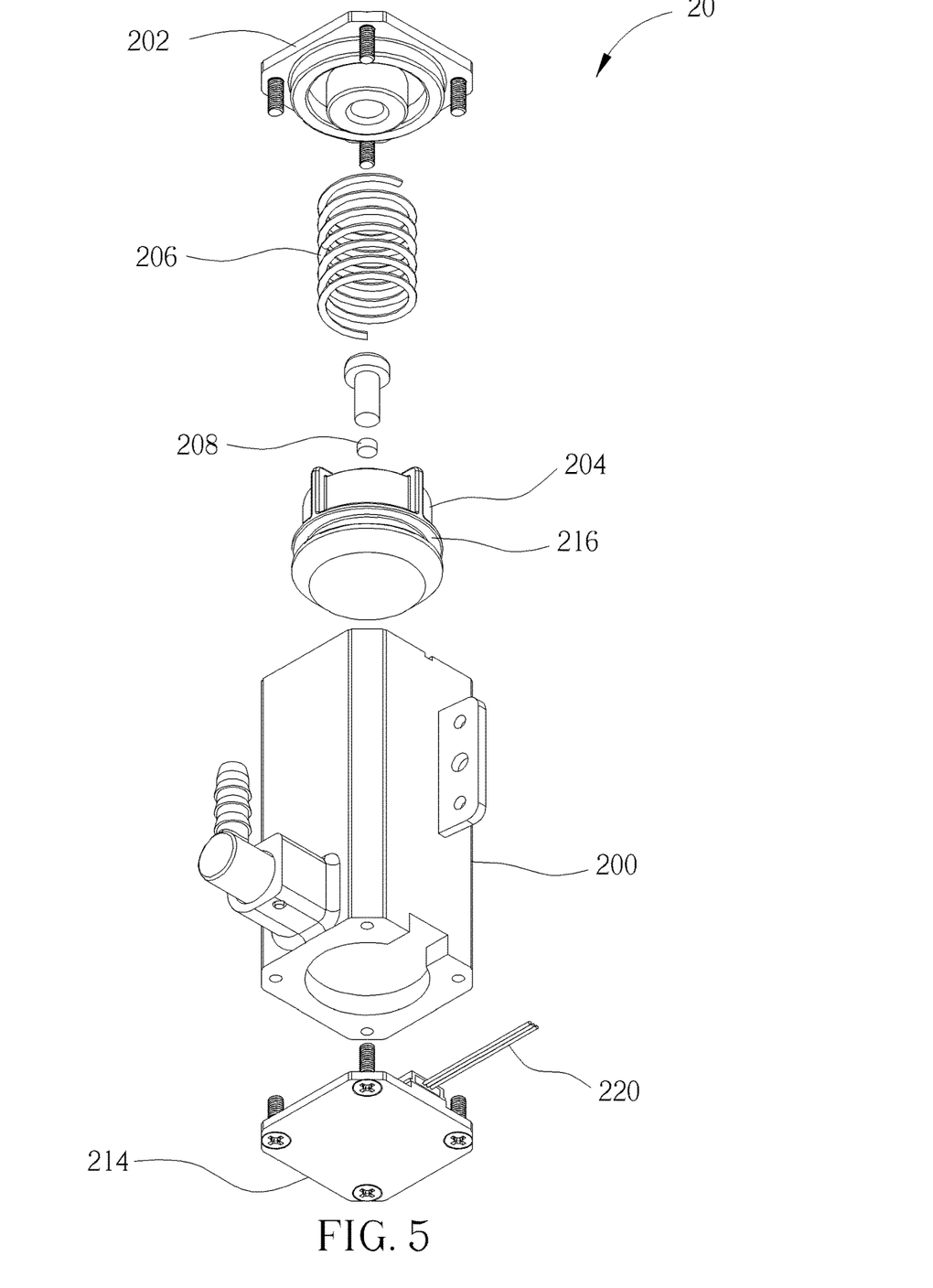
FIG. 5 is an exploded view illustrating the liquid supply device shown in FIG. 3 from another viewing angle.
Figure 6:
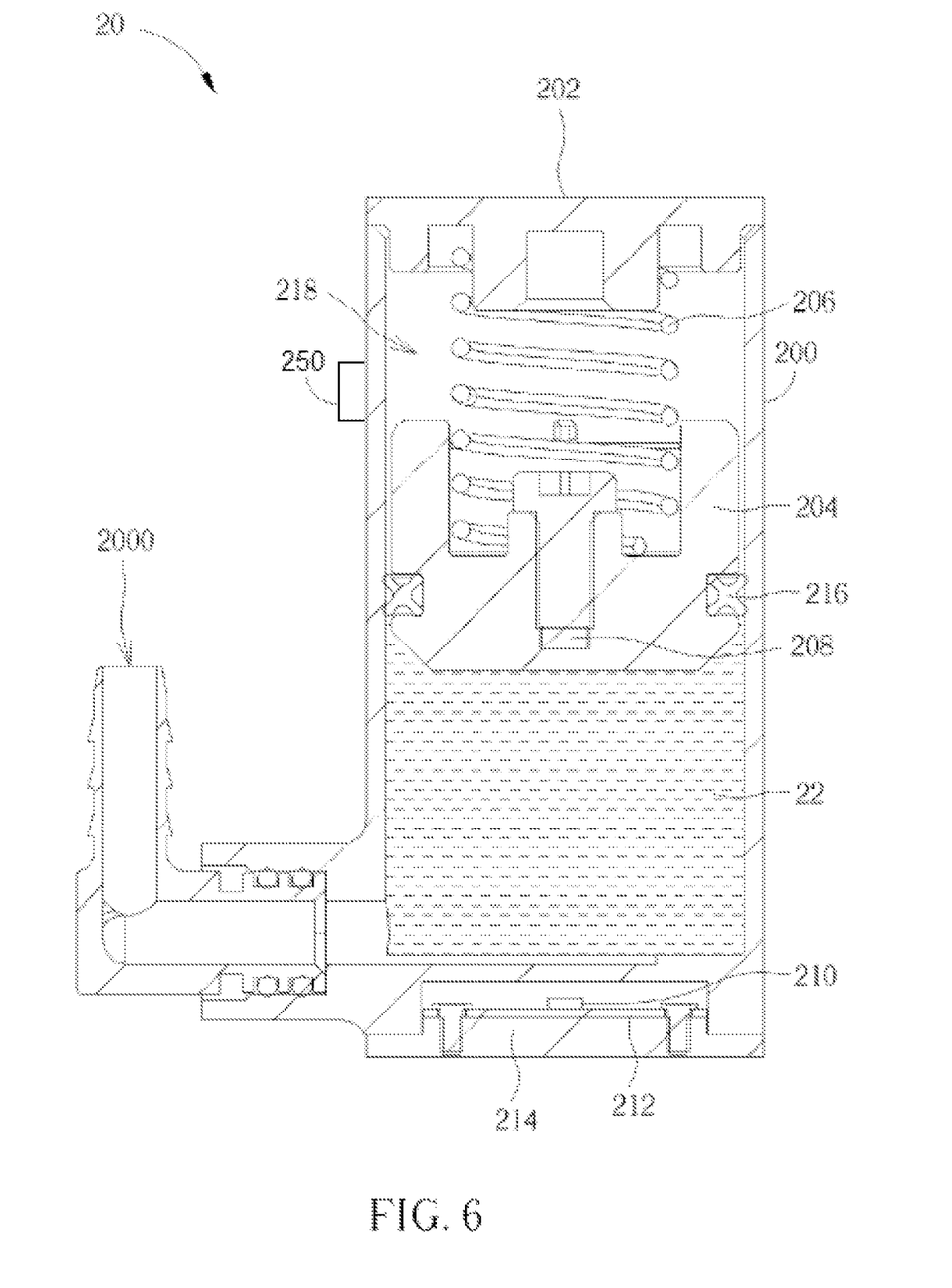
FIG. 6 is a cross-sectional view illustrating the liquid supply device shown in FIG. 3 along line X-X.

Referring to FIGS. 1 to 6, FIG. 1 is a schematic view illustrating a liquid cooling system 1 according to an embodiment of the invention, FIG. 2 is a schematic view illustrating a liquid cooling system 1' according to another embodiment of the invention, FIG. 3 is a schematic view illustrating a liquid supply device 20 according to an embodiment of the invention, FIG. 4 is an exploded view illustrating the liquid supply device 20 shown in FIG. 3, FIG. 5 is an exploded view illustrating the liquid supply device 20 shown in FIG. 3 from another viewing angle, and FIG. 6 is a cross-sectional view illustrating the liquid supply device 20 shown in FIG. 3 along line X-X.

As shown in FIG. 1, the liquid cooling system 1 comprises a liquid cooling head 10, a radiator 12, a pump 14, a liquid storage box 16 and a plurality of tubes 18. The tubes 18 are connected among the liquid cooling head 10, the radiator 12, the pump 14 and the liquid storage box 16 and used for transporting a cooling liquid among the liquid cooling head 10, the radiator 12, the pump 14 and the liquid storage box 16. The cooling liquid (not shown in FIG. 1) is filled in the liquid cooling head 10, the radiator 12, the pump 14, the liquid storage box 16 and the tubes 18. When the liquid cooling system 1 of the invention is used for dissipating heat from an electronic component (not shown), the liquid cooling head 10 of the liquid cooling system 1 is attached on the electronic component. The pump 14 transports the cooling liquid to the liquid cooling head 10, the cooling liquid absorbs the heat generated by the electronic component, and then the radiator 12 cools the cooling liquid.

Compared to the liquid cooling system 1 shown in FIG. 1, the liquid cooling system 1' shown in FIG. 2 comprises a liquid cooling head 10', a radiator 12 and a plurality of tubes 18. In the liquid cooling system 1', the liquid cooling head 10' may function as a pump. In other words, the pump 14 of the liquid cooling system 1 may be integrated into the liquid cooling head 10' of the liquid cooling system 1'. Furthermore, in the liquid cooling system 1', the liquid storage box 16 of the liquid cooling system 1 is omitted. In other embodiments, the liquid storage box 16 can be integrated with the radiator 12 or the liquid cooling head 10'. In other words, the liquid cooling system of the invention may be equipped with or not equipped with the liquid storage box 16 according to practical applications. In the liquid cooling system 1', the tubes 18 are connected between the liquid cooling head 10' with a pump function and the radiator 12 and used for transporting a cooling liquid between the liquid cooling head 10' and the radiator 12. The cooling liquid (not shown in FIG. 1) is filled in the liquid cooling head 10', the radiator 12 and the tubes 18. When the liquid cooling system 1' of the invention is used for dissipating heat from an electronic component (not shown), the liquid cooling head 10' of the liquid cooling system 1' is attached on the electronic component. The cooling liquid of the liquid cooling head 10' absorbs the heat generated by the electronic component and then the radiator 12 cools the cooling liquid.

As shown in FIGS. 3 to 6, the aforesaid liquid cooling system 1 or liquid cooling system 1' further comprises a liquid supply device 20, wherein the liquid supply device 20 may be selectively connected to one of the liquid cooling head 10, the radiator 12, the pump 14, the liquid storage box 16 and the tubes 18 shown in FIG. 1 or selectively connected to one of the liquid cooling head 10', the radiator 12 and the tubes 18 shown in FIG. 2 according to practical applications. In the liquid cooling system 1', the liquid supply device 20 may have the function of the liquid storage box.

The liquid supply device 20 comprises a casing 200, a cover 202, a plunger 204, a driving unit 206, a magnetic member 208, a sensing unit 210, a circuit board 212, a support base 214 and a washer 216. The casing 200 has a liquid outlet 2000. The cover 202 is connected to the casing 200 and a chamber 218 is formed between the casing 200 and the cover 202. The chamber 218 communicates with the liquid outlet 2000 and contains a cooling liquid 22. In practical applications, the cooling liquid 22 may be water or other cooling liquids. The plunger 204 is movably disposed in the chamber 218. The washer 216 is sleeved on an outer wall of the plunger 204 and abuts against an inner wall of the casing 200. Accordingly, the washer 216 can prevent the cooling liquid 22 from entering a space between the cover 202 and the plunger 204.

When the liquid supply device 20 is connected to one of the liquid cooling head 10, the radiator 12, the pump 14, the liquid storage box 16 and the tubes 18 shown in FIG. 1 or connected to one of the liquid cooling head 10', the radiator 12 and the tubes 18 shown in FIG. 2, the liquid outlet 2000 communicates with one of the liquid cooling head 10, 10', the radiator 12, the pump 14, the liquid storage box 16 and the tubes 18, such that the cooling liquid 22 of the chamber 218 can be injected into one of the liquid cooling head 10, 10', the radiator 12, the pump 14, the liquid storage box 16 and the tubes 18 through the liquid outlet 2000.

The driving unit 206 is disposed in the chamber 218 and the driving unit 206 is used for driving the plunger 204 to move. In this embodiment, the driving unit 206 may be a resilient member (e.g. spring or other resilient objects) and opposite ends of the driving unit 206 abut against the cover 202 and the plunger 204, respectively. Moreover, the magnetic member 208 is disposed on the plunger 204 and the sensing unit 210 is disposed on a bottom of the casing 200. In this embodiment, the circuit board 212 is disposed on the support base 214, the sensing unit 210 is disposed on the circuit board 212, and the support base 214 is connected to the bottom of the casing 200, such that the sensing unit 210 is disposed on the bottom of the casing 200. The sensing unit 210 is used for sensing a magnetic field generated by the magnetic member 208. In this embodiment, the magnetic member 208 may be a magnet and the sensing unit 210 may be a Hall sensor.

As shown in FIG. 6, when the liquid supply device 20 is assembled completely and the chamber 218 contains the cooling liquid 22, the driving unit 206 is compressed. At this time, the driving unit 206 pushes the plunger 204 to move downward in the chamber 218 till the hydraulic pressure of the liquid cooling system 1 or 1' balances. When the cooling liquid of the liquid cooling system 1 or 1' reduces and then the hydraulic pressure reduces, the driving unit 206 of the liquid supply device 20 will push the plunger 204 to move, so as to inject the cooling liquid 22 from the chamber 218 into one of the liquid cooling head 10, 10', the radiator 12, the pump 14, the liquid storage box 16 and the tubes 18. In other words, the liquid supply device 20 of the invention can supply the cooling liquid to the liquid cooling system 1 or 1' automatically when the cooling liquid is insufficient, so as to prevent the liquid cooling system 1 or 1' from being damaged due to insufficient cooling liquid. It should be noted that in addition to using the driving unit 206 to generate elastic force to push the plunger 204 to move, the invention may also replace the driving unit 206 by other mechanisms, which may generate normal force, shearing force, torque or magnetic force, to push the plunger 204 to move, so as to supply the cooling liquid.

Furthermore, when the cooling liquid 22 of the liquid supply device 20 reduces and then the plunger 204 moves to a specific position, the sensing unit 210 will sense the magnetic field generated by the magnetic member 208 and output a sensing signal with a predetermined status through a transmitting line 220 when an intensity of the magnetic field is larger than a threshold. At this time, a processor (not shown) can determine the liquid level of the cooling liquid 22 and control an alarm unit to send out an alarm message (e.g. light, sound or text) as the liquid level of the cooling liquid 22 is equal to or lower than a predetermined height according to the sensing signal with the predetermined status, so as to notice a user to supply the cooling liquid 22 to the liquid supply device 20. In some embodiments, the aforesaid processor maybe disposed inside or outside the liquid cooling system and the invention is not limited to a specific manner. For example, when the sensing unit 210 does not sense the magnetic field generated by the magnetic member 208, the sensing unit 210 may output a high level voltage; and when the sensing unit 210 senses the magnetic field generated by the magnetic member 208, the sensing unit 210 may output a low level voltage (i.e. the aforesaid sensing signal with the predetermined status). The invention may dispose a light emitting unit 250 (e.g. light emitting diode) on the casing 200 of the liquid supply device 20. When the processor (not shown) receives the aforesaid sensing signal, the processor can control the light emitting unit 250 to emit light, so as to notice the user to supply the cooling liquid 22 to the liquid supply device 20.

The invention may also dispose the sensing unit 210 or/and the circuit board 212 on a side wall of the casing 200, i.e. the invention is not limited to dispose the sensing unit 210 and the circuit board 212 on the bottom of the casing 200. Furthermore, the invention may also dispose the magnetic member 208 on the bottom or the side wall of the casing 200 and dispose the sensing unit 210 or/and the circuit board 212 on the plunger 204 according to practical applications. When the sensing unit 210 and the circuit board 212 are disposed on the plunger 204, the transmitting line 220 may be pulled out from the cover 202. Accordingly, the magnetic member 208 may be selectively disposed on one of the casing 200 and the plunger 204, and the sensing unit 210 may be selectively disposed on the other one of the casing 200 and the plunger 204 according to practical applications.

Figure 7:
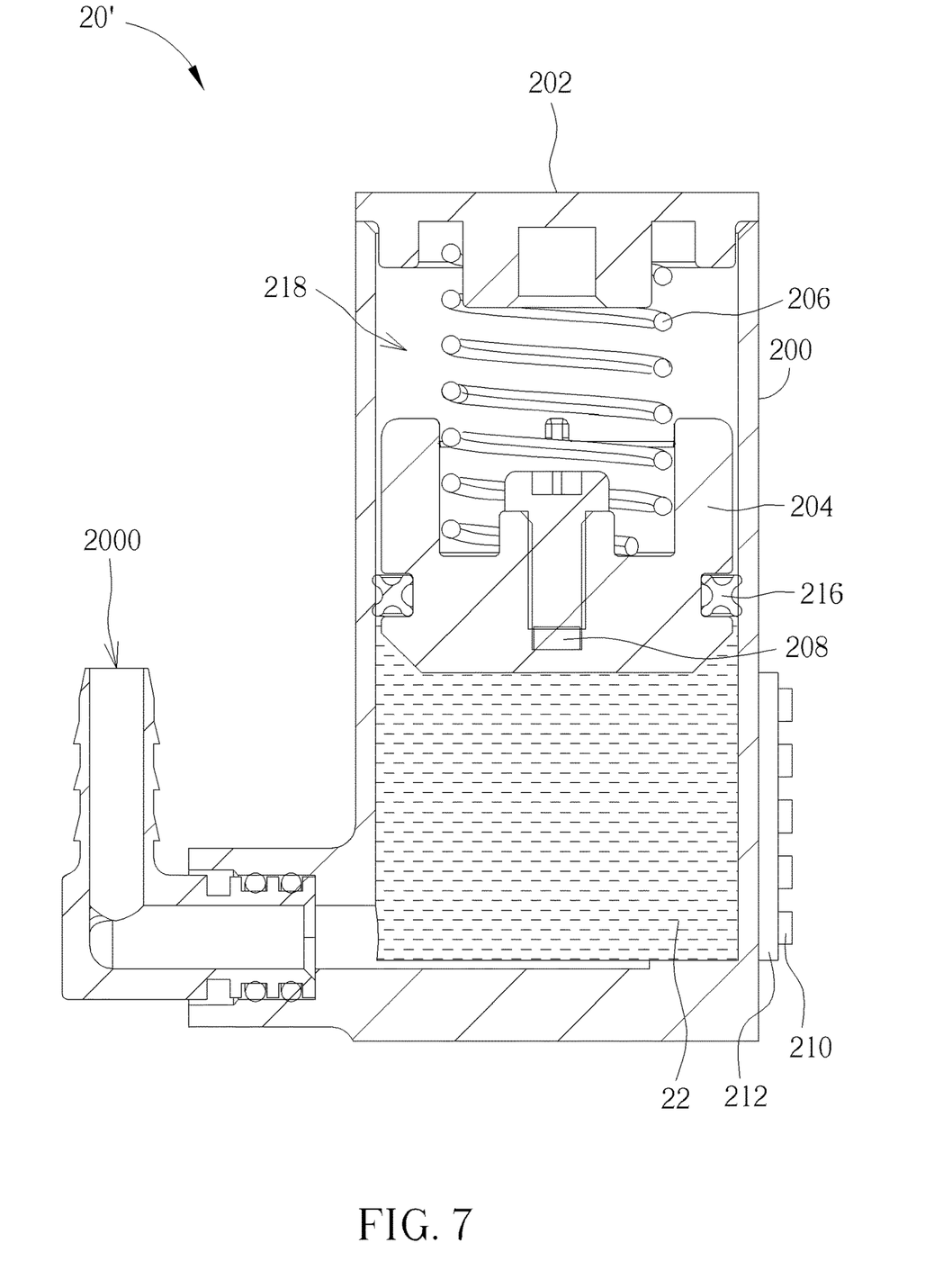
FIG. 7 is a cross-sectional view illustrating a liquid supply device according to another embodiment of the invention.

Referring to FIG. 7, FIG. 7 is a cross-sectional view illustrating a liquid supply device 20' according to another embodiment of the invention. The difference between the liquid supply device 20' and the aforesaid liquid supply device 20 is that the liquid supply device 20' comprises a plurality of sensing units 210. As shown in FIG. 7, the magnetic member 208 is disposed on the plunger 204 and the plurality of sensing units 210 are disposed on the side wall of the casing 200. In this embodiment, the invention may dispose the plurality of sensing units 210 on the circuit board 212 and dispose the circuit board 212 on the side wall of the casing 200. When the cooling liquid 22 of the liquid supply device 20' reduces and then the plunger 204 moves to a specific range corresponding to any one of the sensing units 210, the corresponding sensing unit 210 will sense the magnetic field generated by the magnetic member 208 and output the sensing signal with the predetermined status to the processor (not shown) when the intensity of the magnetic field is larger than the threshold, so as to determine the liquid level of the cooling liquid 22. Accordingly, the user can know well the remaining amount of the cooling liquid 22 of the liquid supply device 20' anytime. It should be noted that the same elements in FIG. 7 and FIG. 6 are represented by the same numerals, so the repeated explanation will not be depicted herein again.

Figure 8:
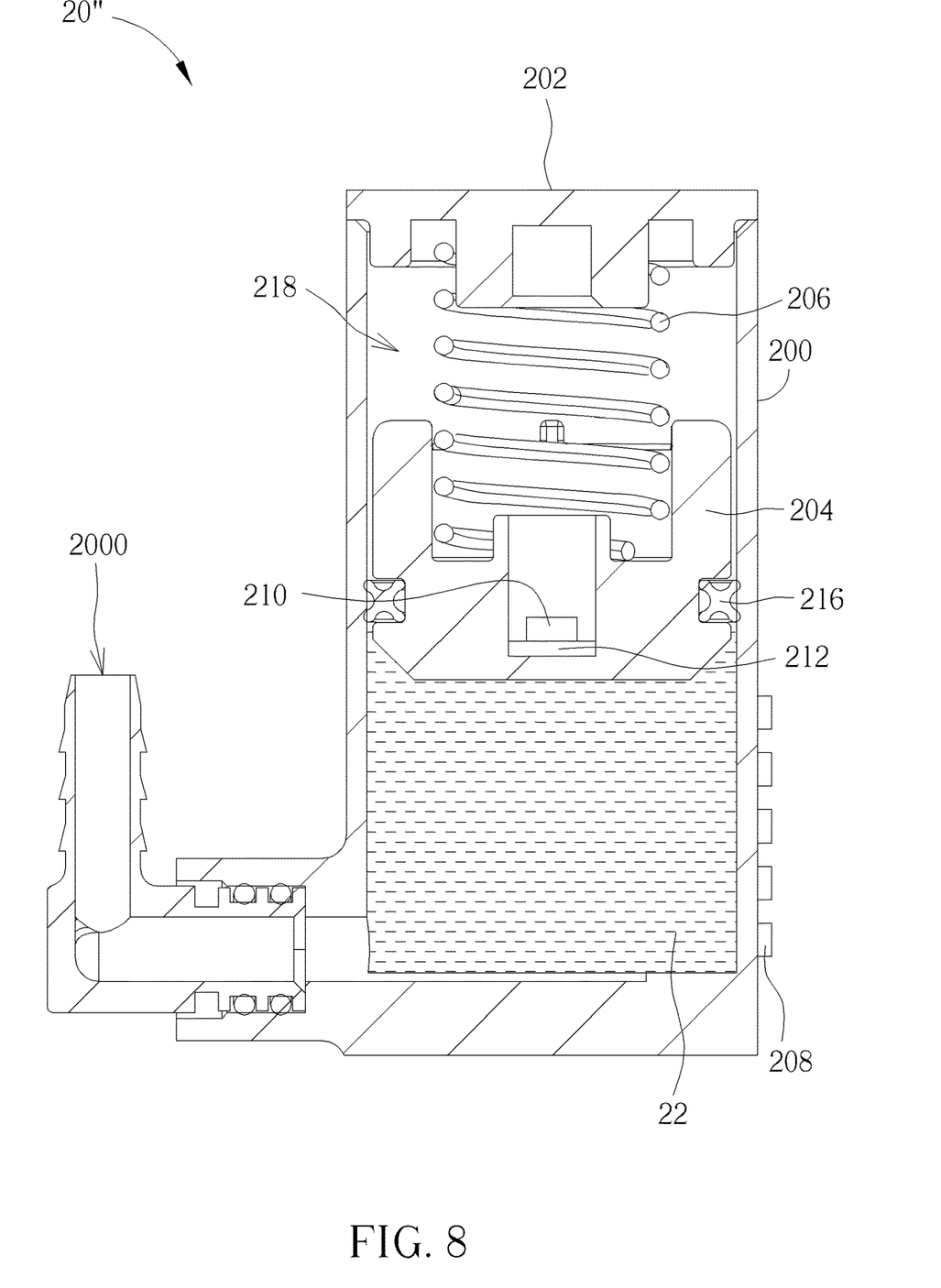
FIG. 8 is a cross-sectional view illustrating a liquid supply device according to another embodiment of the invention.

Referring to FIG. 8, FIG. 8 is a cross-sectional view illustrating a liquid supply device 20" according to another embodiment of the invention. The difference between the liquid supply device 20" and the aforesaid liquid supply device 20 is that the liquid supply device 20" comprises a plurality of magnetic members 208. As shown in FIG. 8, the plurality of magnetic members 208 are disposed on the side wall of the casing 200 and the sensing unit 210 is disposed on the plunger 204. In this embodiment, the invention may dispose the sensing unit 210 on the circuit board 212 and dispose the circuit board 212 on the plunger 204. When the cooling liquid 22 of the liquid supply device 20''' reduces and then the plunger 204 moves to a specific position corresponding to any one of the magnetic members 208, the sensing unit 210 will sense the magnetic field generated by the corresponding magnetic member 208 and output the sensing signal with the predetermined status to the processor (not shown) when the intensity of the magnetic field is larger than the threshold, so as to determine the liquid level of the cooling liquid 22. Accordingly, the user can know well the remaining amount of the cooling liquid 22 of the liquid supply device 20" anytime. It should be noted that the same elements in FIG. 8 and FIG. 6 are represented by the same numerals, so the repeated explanation will not be depicted herein again.

Figure 9:
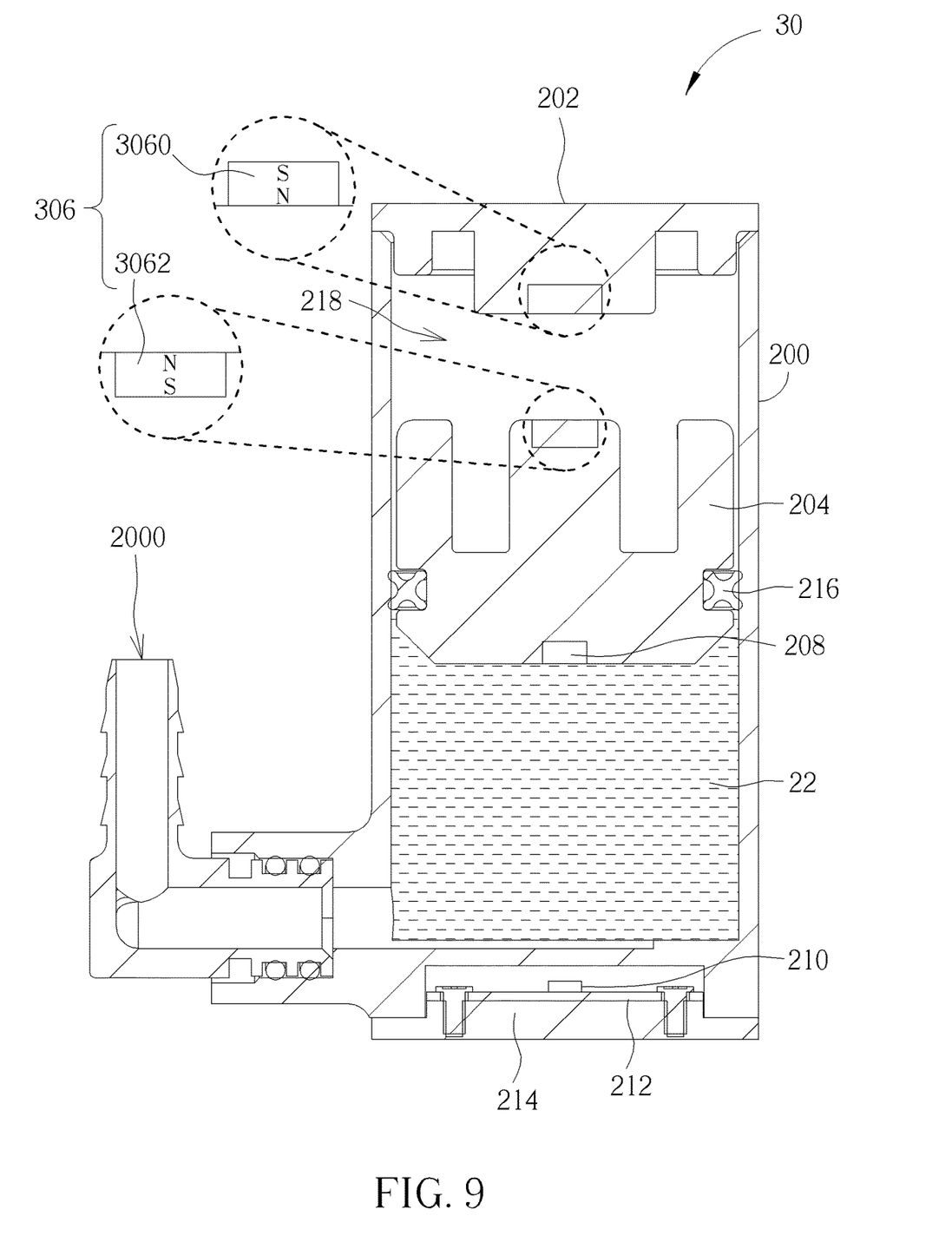
FIG. 9 is a cross-sectional view illustrating a liquid supply device according to another embodiment of the invention.

Referring to FIG. 9, FIG. 9 is a cross-sectional view illustrating a liquid supply device 30 according to another embodiment of the invention. The difference between the liquid supply device 30 and the aforesaid liquid supply device 20 is that the liquid supply device 30 replaces the aforesaid driving unit 206 by a driving unit 306. As shown in FIG. 9, the driving unit 306 comprises a first magnetic area 3060 and a second magnetic area 3062. The first magnetic area 3060 is disposed on the cover 202 and the second magnetic area 3062 is disposed on the plunger 204, wherein a position of the first magnetic area 3060 is corresponding to a position of the second magnetic area 3062. A magnetic pole of an end of the first magnetic area 3060 facing the second magnetic area 3062 is identical to a magnetic pole of an end of the second magnetic area 3062 facing the first magnetic area 3060, such that a magnetic repulsive force is generated between the first magnetic area 3060 and the second magnetic area 3062. It should be noted that the magnetic pole of an end of the first magnetic area 3060 facing the second magnetic area 3062 and the magnetic pole of an end of the second magnetic area 3062 facing the first magnetic area 3060 both may be north magnetic poles or south magnetic poles according to practical applications. In this embodiment, the first magnetic area 3060 may be a magnet or an electromagnet, and the second magnetic area 3062 may be a magnet. It should be noted that the same elements in FIG. 9 and FIG. 6 are represented by the same numerals, so the repeated explanation will not be depicted herein again.

When the liquid supply device 30 is assembled completely and the chamber 218 contains the cooling liquid 22, the magnetic repulsive force generated between the first magnetic area 3060 and the second magnetic area 3062 balances with the hydraulic pressure generated by the cooling liquid 22. Meanwhile, the plunger 204 stays static in the chamber 218. When the cooling liquid of the liquid cooling system 1 or 1' reduces and then the hydraulic pressure reduces, the magnetic repulsive force generated between the first magnetic area 3060 and the second magnetic area 3062 will push the plunger 204 to move, so as to inject the cooling liquid 22 from the chamber 218 into one of the liquid cooling head 10, 10', the radiator 12, the pump 14, the liquid storage box 16 and the tubes 18. In other words, the liquid supply device 30 of the invention can supply the cooling liquid to the liquid cooling system 1 or 1' automatically when the cooling liquid is insufficient, so as to prevent the liquid cooling system 1 or 1' from being damaged due to insufficient cooling liquid. When the magnetic repulsive force generated between the first magnetic area 3060 and the second magnetic area 3062 balances with the hydraulic pressure generated by the cooling liquid 22 again, the plunger 204 stops moving.

Figure 10:
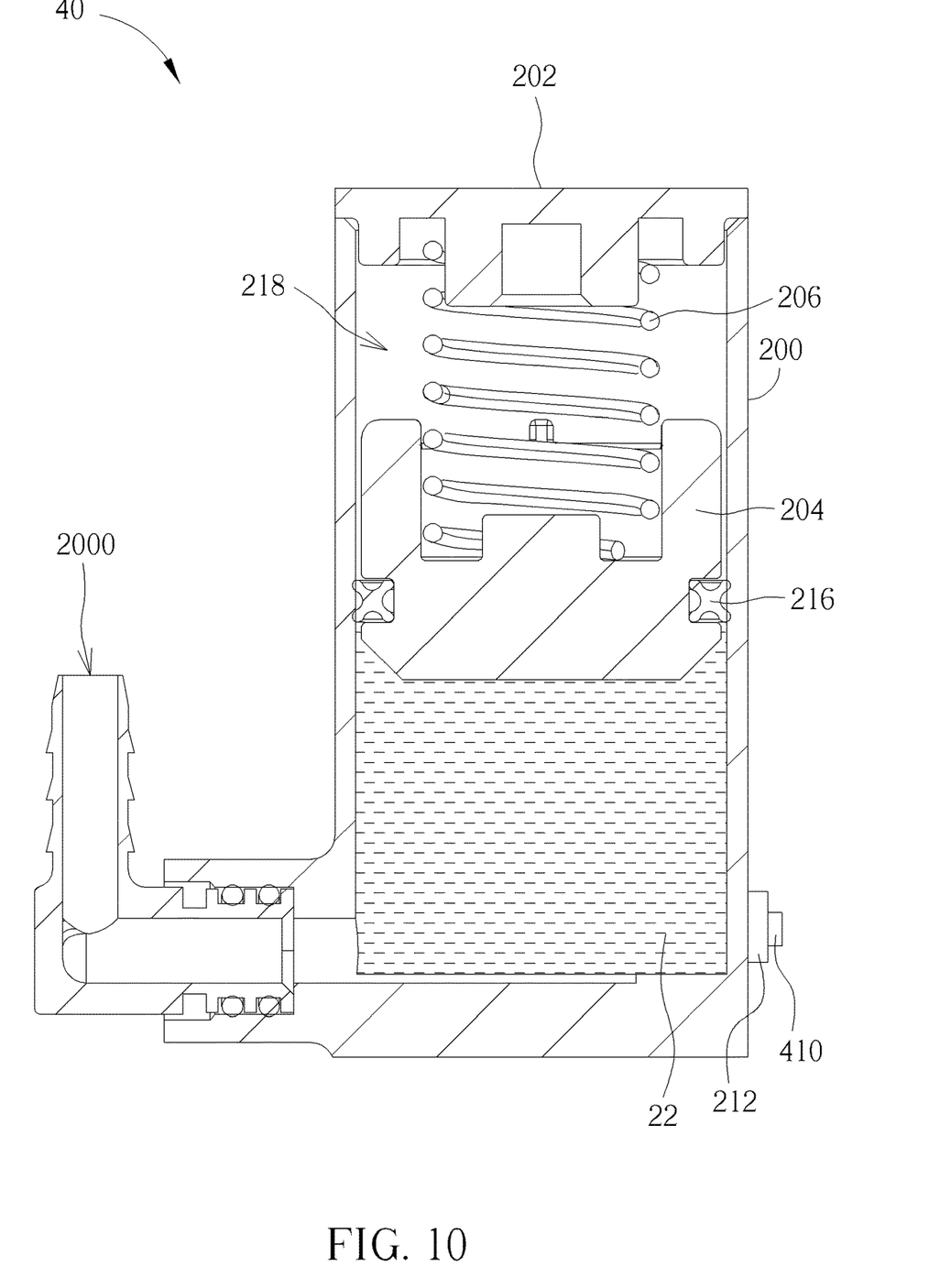
FIG. 10 is a cross-sectional view illustrating a liquid supply device according to another embodiment of the invention.

Referring to FIG. 10, FIG. 10 is a cross-sectional view illustrating a liquid supply device 40 according to another embodiment of the invention. The difference between the liquid supply device 40 and the aforesaid liquid supply device 20 is that the liquid supply device 40 does not comprise the magnetic member 208 and the sensing unit 410 of the liquid supply device 40 is a capacitance type sensing unit (e.g. capacitive sensor). As shown in FIG. 10, the sensing unit 410 is disposed on a side wall of the casing 200. In this embodiment, the invention may dispose the sensing unit 410 on the circuit board 212 and dispose the circuit board 212 on the side wall of the casing 200. When the cooling liquid 22 of the liquid supply device 40 reduces and then the plunger 204 moves to a position corresponding to the sensing unit 410, the sensing unit 410 will sense a capacitance variation induced by the cooling liquid 22 and output a sensing signal with a predetermined status to a processor (not shown) when the capacitance variation is larger than a threshold, so as to determine the liquid level of the cooling liquid 22. For example, when the sensing unit 410 does not sense capacitance variation, the sensing unit 410 may output a high level voltage; and when the sensing unit 410 senses the capacitance variation induced by the cooling liquid 22, the sensing unit 410 may output a low level voltage (i.e. the aforesaid sensing signal with the predetermined status). Accordingly, the user can know well the remaining amount of the cooling liquid 22 of the liquid supply device 40. It should be noted that the same elements in FIG. 10 and FIG. 6 are represented by the same numerals, so the repeated explanation will not be depicted herein again.

In this embodiment, the sensing unit 410 is disposed outside the casing 200. However, in other embodiments, the sensing unit 410 may be disposed inside the casing 200 according to practical applications. Furthermore, there may be more than one sensing unit 410 disposed on the side wall of the casing 200, so as to determine different liquid levels of the cooling liquid 22 as the cooling liquid 22 is reducing.

As mentioned in the above, the liquid supply device of the invention is selectively connected to one of the liquid cooling head, the radiator, the pump, the liquid storage box and the tubes. When the cooling liquid reduces and then the hydraulic pressure of the liquid cooling system reduces, the liquid supply device utilizes the driving unit to drive the plunger to move, so as to inject the cooling liquid from the chamber into the liquid cooling system. In other words, the liquid supply device of the invention can supply the cooling liquid to the liquid cooling system automatically when the cooling liquid is insufficient, so as to prevent the liquid cooling system from being damaged due to insufficient cooling liquid. Furthermore, when the cooling liquid of the liquid supply device reduces and then the plunger moves to a specific position, the sensing unit will sense the liquid level of the cooling liquid and output the sensing signal with the predetermined status as the liquid level is equal to or lower than a predetermined height. When the processor receives the sensing signal with the predetermined status, the processor may send out an alarm message (e.g. light, sound or text), so as to notice a user to supply the cooling liquid to the liquid supply device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A liquid supply device with a liquid level detecting function adapted to a liquid cooling system, the liquid supply device comprising:
   a casing having a liquid outlet;
   a cover connected to the casing, a chamber being formed between the casing and the cover and adapted to contain a cooling liquid, the chamber communicating with the liquid outlet;
   a plunger movably disposed in the chamber;
   a spring disposed in the chamber between the cover and a first surface of the plunger which moves with respect to the chamber, the first surface being formed opposite to a second surface defining a space where the cooling liquid is contained, the spring driving the plunger to move;
   a magnet adapted to generate a magnetic field, the magnet being accommodated in a recess formed on the first surface of the plunger; and
   a sensor disposed on a bottom of the casing to be adapted to sense the magnetic field generated by the magnet and outputting a sensing signal as a liquid level of the cooling liquid is equal to or lower than a predetermined height when an intensity of the magnetic field is larger than a threshold, so as to determine a liquid level of the cooling liquid;
   wherein the space where the cooling liquid is contained is located between the sensor and the magnet.

2. The liquid supply device of claim 1, further comprising a light emitting unit disposed on the casing, the light emitting unit emitting light when the sensor outputs the sensing signal.

3. The liquid supply device of claim 2, wherein the light emitting unit is disposed on a side wall of the casing.

4. The liquid supply device of claim 2, wherein the sensor is a Hall sensor.

5. A liquid cooling system comprising:
   a liquid cooling head;
   a radiator;
   a plurality of tubes connected between the liquid cooling head and the radiator; and
   a liquid supply device-comprising:
   a casing having a liquid outlet;
   a cover connected to the casing, a chamber being formed between the casing and the cover and adapted to contain a cooling liquid, the chamber communicating with the liquid outlet;
   a plunger movably disposed in the chamber;
   a spring disposed in the chamber between the cover and a first surface of the plunger which moves with respect to the chamber, the first surface being formed opposite to a second surface defining a space where the cooling liquid is contained, the spring driving the plunger to move;
   a magnet adapted to generate a magnetic field, the magnet being accommodated in a recess formed on the first surface of the plunger; and
   a sensor disposed on a bottom of the casing to be adapted to sense the magnetic field generated by the magnet and outputting a sensing signal as a liquid level of the cooling liquid is equal to or lower than a predetermined height when an intensity of the magnetic field is larger than a threshold, so as to determine a liquid level of the cooling liquid;
   wherein the space where the cooling liquid is contained is located between the sensor and the magnet.

6. The liquid cooling system of claim 5, wherein the liquid supply device further comprises a light emitting unit disposed on the casing, wherein the light emitting unit emits light when the sensor outputs the sensing signal.

7. The liquid cooling system of claim 6, wherein the light emitting unit is disposed on a side wall of the casing.

8. The liquid cooling system of claim 6, wherein the sensor is a Hall sensor.

9. The liquid cooling system of claim 5, further comprising a pump, the tubes being connected between the liquid cooling head, the radiator and the pump.

10. The liquid cooling system of claim 5, further comprising a liquid storage box, the tubes being connected between the liquid cooling head, the radiator and the liquid storage box, and the liquid supply device being connected to either the liquid cooling head, the radiator, the liquid storage box or the tubes.

11. A liquid supply device with a liquid level detecting function adapted to a liquid cooling system, the liquid supply device comprising:
   a casing having a liquid outlet;
   a cover connected to the casing, a chamber being formed between the casing and the cover and adapted to contain a cooling liquid, the chamber communicating with the liquid outlet;
   a plunger movably disposed in the chamber;
   a spring disposed in the chamber between the cover and a first surface of the plunger which moves with respect to the chamber, the first surface being formed opposite to a second surface defining a space where the cooling liquid is contained, the spring driving the plunger to move;
   a magnet adapted to generate a magnetic field; and
   a sensor adapted to sense the magnetic field generated by the magnet and outputting a sensing signal as the liquid level is equal to or lower than a predetermined height when an intensity of the magnetic field is larger than a threshold, so as to determine a liquid level of the cooling liquid;
   wherein a recess is formed at an end of the plunger opposite to the second surface, and the magnet is accommodated in the recess, such that the magnet is movably disposed in the chamber, and
   wherein the space where the cooling liquid is contained is located between the sensor and the magnet.

12. The liquid supply device of claim 11, wherein the sensor is disposed on a bottom of the casing.

13. The liquid supply device of claim 11, further comprising a light emitting unit disposed on the casing, the light emitting unit emitting light when the sensor outputs the sensing signal.

14. The liquid supply device of claim 13, wherein the light emitting unit is disposed on a side wall of the casing.

* * * * *